United States Patent
Emerson et al.

(10) Patent No.: US 8,957,435 B2
(45) Date of Patent: Feb. 17, 2015

(54) LIGHTING DEVICE

(75) Inventors: David Todd Emerson, Chapel Hill, NC (US); Wooh Jae Kim, Cary, NC (US); Mark Terrence McClear, Cary, NC (US)

(73) Assignee: Cree, Inc., Durham, NC (US)

( * ) Notice: Subject to any disclaimer, the term of this patent is extended or adjusted under 35 U.S.C. 154(b) by 371 days.

(21) Appl. No.: 12/769,354

(22) Filed: Apr. 28, 2010

(65) Prior Publication Data

US 2010/0270567 A1    Oct. 28, 2010

Related U.S. Application Data

(60) Provisional application No. 61/173,466, filed on Apr. 28, 2009.

(51) Int. Cl.
*H01L 31/18*     (2006.01)
*F21K 99/00*     (2010.01)
*H01L 25/075*    (2006.01)
*H05B 33/08*     (2006.01)
*H01L 33/50*     (2010.01)
(Continued)

(52) U.S. Cl.
CPC ... *H01L 25/0753* (2013.01); *H01L 2224/48091* (2013.01); *F21K 9/00* (2013.01); *H01L 33/50* (2013.01); *H01L 2933/0091* (2013.01); *H01L 33/486* (2013.01); *H01L 2224/48247* (2013.01); *H01L 2224/73265* (2013.01); *H05B 33/0803* (2013.01); *H01L 33/58* (2013.01); *H01L 2224/48465* (2013.01); *Y10S 362/80* (2013.01)
USPC ............. 257/98; 257/99; 257/100; 257/88; 257/79; 362/800

(58) Field of Classification Search
USPC ............. 362/800, 97.2, 97.3, 231, 235, 293, 362/307, 296.02, 311.01, 311.03; 257/98, 257/99, 100, 88, 79
See application file for complete search history.

(56) References Cited

U.S. PATENT DOCUMENTS

| 5,359,345 A | 10/1994 | Hunter |
| 6,350,041 B1 | 2/2002 | Tarsa et al. |

(Continued)

FOREIGN PATENT DOCUMENTS

| JP | 2004-023099 A | 1/2004 |
| JP | 2005-005482 A | 1/2005 |
| WO | WO 2009/111872 A1 | 9/2009 |

OTHER PUBLICATIONS

Comrie, M., "Full Color LED Added to Lumex's Lineup", "EBN", Jun. 19, 1995, p. 28.

(Continued)

*Primary Examiner* — Michael Shingleton
(74) *Attorney, Agent, or Firm* — Withrow & Terranova, P.L.L.C.; Vincent K. Gustafson

(57) ABSTRACT

A light emission package includes multiple colored solid state emitters each having a different non-white dominant wavelength in the visible range, and at least one lumiphor arranged to receive emissions from at least one other solid state emitter, with each emitter arranged on or adjacent to a common submount. The at least one other emitter and lumiphor may be arranged in combination to emit white light. Each emitter is independently controllable, permitting color and/or color temperature of a lighting device to be varied during operation of the device. At least one white emitter may be combined with red, green, and blue LEDs.

8 Claims, 12 Drawing Sheets

(51) Int. Cl.
*H01L 33/48* (2010.01)
*H01L 33/58* (2010.01)

(56) References Cited

U.S. PATENT DOCUMENTS

| | | | |
|---|---|---|---|
| 6,498,440 | B2 | 12/2002 | Stam et al. |
| 6,617,795 | B2 | 9/2003 | Bruning |
| 6,636,003 | B2 | 10/2003 | Rahm et al. |
| 7,083,302 | B2 | 8/2006 | Chen et al. |
| 7,095,056 | B2 | 8/2006 | Vitta et al. |
| 7,213,940 | B1 | 5/2007 | van de Ven et al. |
| 7,244,965 | B2 | 7/2007 | Andrews et al. |
| 7,456,499 | B2 | 11/2008 | Loh et al. |
| 7,513,671 | B2 * | 4/2009 | Ng et al. ............... 362/612 |
| 7,564,180 | B2 | 7/2009 | Brandes |
| 7,655,957 | B2 | 2/2010 | Loh et al. |
| 7,692,206 | B2 | 4/2010 | Loh |
| 8,339,029 | B2 | 12/2012 | Kim et al. |
| 2006/0149607 | A1 | 7/2006 | Sayers et al. |
| 2006/0221272 | A1 | 10/2006 | Negley et al. |
| 2007/0034885 | A1 * | 2/2007 | Braune et al. ............ 257/98 |
| 2007/0139920 | A1 | 6/2007 | Van De Ven et al. |
| 2007/0170447 | A1 | 7/2007 | Negley et al. |
| 2007/0223219 | A1 | 9/2007 | Medendorp, Jr. et al. |
| 2008/0012036 | A1 | 1/2008 | Loh et al. |
| 2008/0032142 | A1 * | 2/2008 | Tasumi et al. ............ 428/447 |
| 2008/0121921 | A1 | 5/2008 | Loh et al. |
| 2008/0198112 | A1 | 8/2008 | Roberts |
| 2008/0283861 | A1 * | 11/2008 | Loh et al. ............... 257/98 |
| 2008/0290353 | A1 | 11/2008 | Medendorp, Jr. |
| 2008/0296592 | A1 * | 12/2008 | Osamu .................. 257/89 |
| 2008/0308825 | A1 | 12/2008 | Chakraborty et al. |
| 2009/0033612 | A1 * | 2/2009 | Roberts et al. ............ 345/102 |
| 2009/0050908 | A1 | 2/2009 | Yuan et al. |
| 2009/0080185 | A1 | 3/2009 | McMillan |
| 2009/0195137 | A1 | 8/2009 | Brandes |
| 2010/0140634 | A1 | 6/2010 | van de Ven et al. |

OTHER PUBLICATIONS

Co-pending U.S. Appl. No. 12/566,253.
Co-pending U.S. Appl. No. 12/756,725.

* cited by examiner

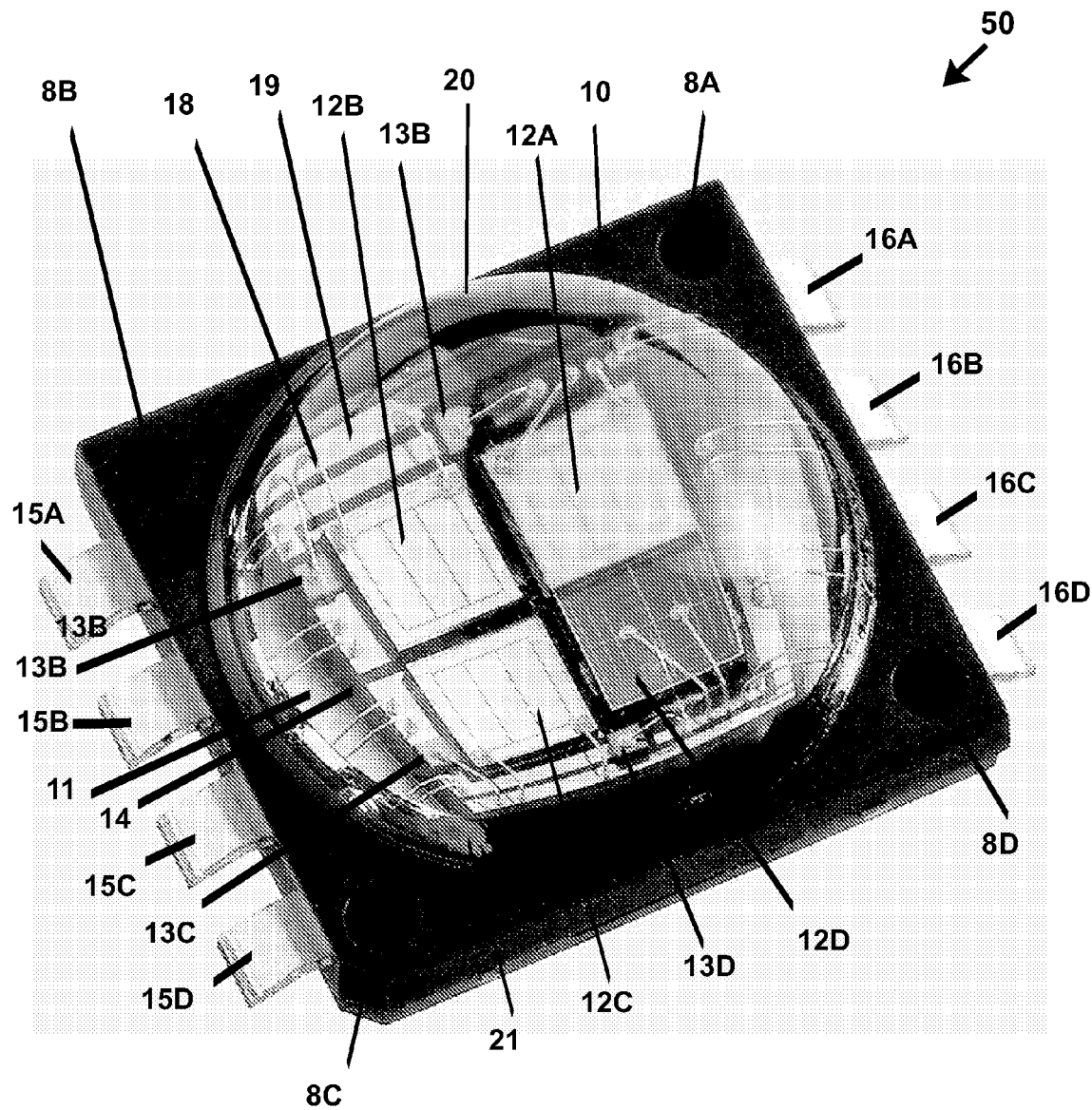
FIG._1

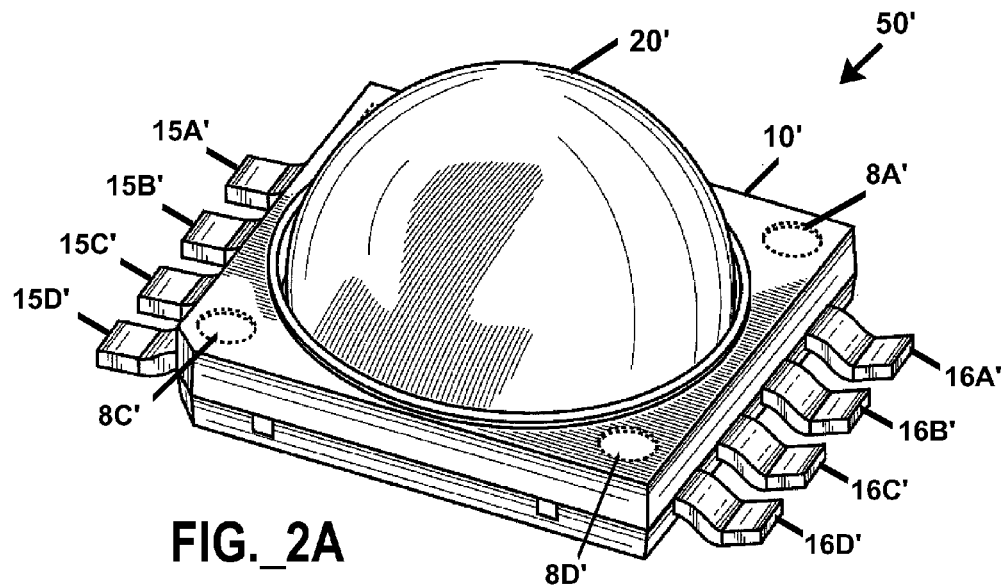
FIG._2A
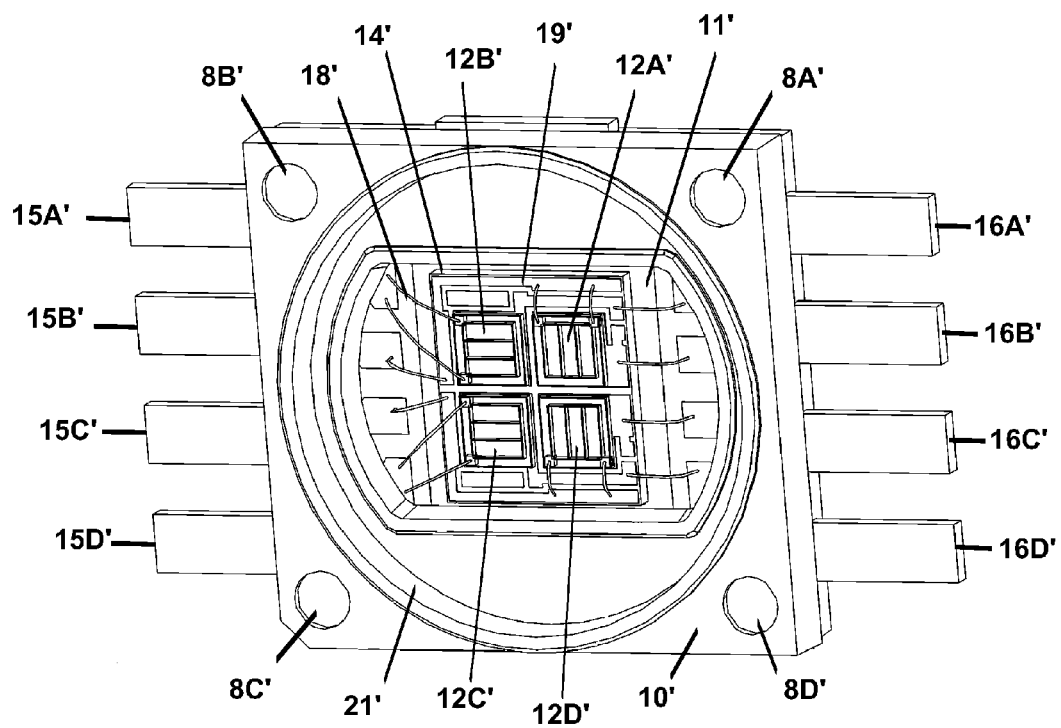
FIG._2B

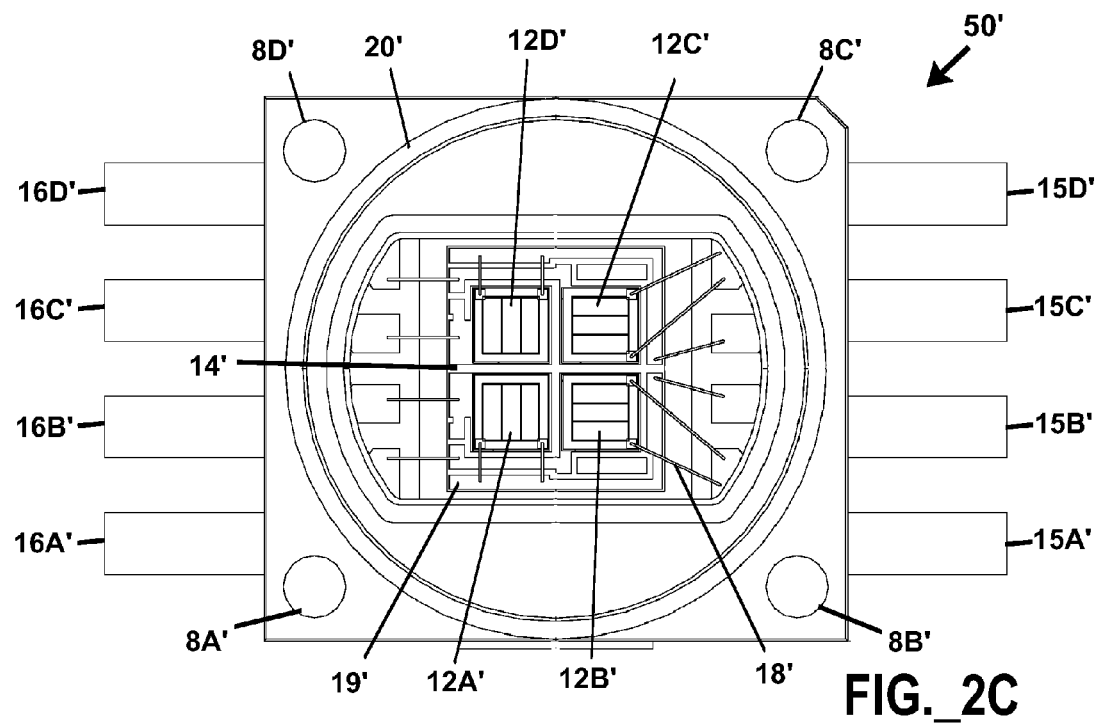
FIG._2C
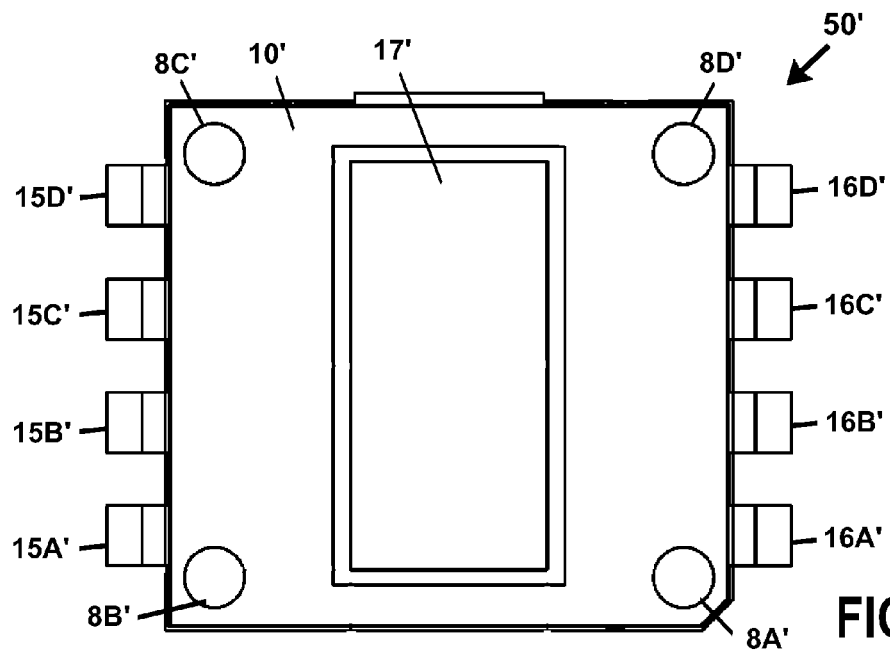
FIG._2D

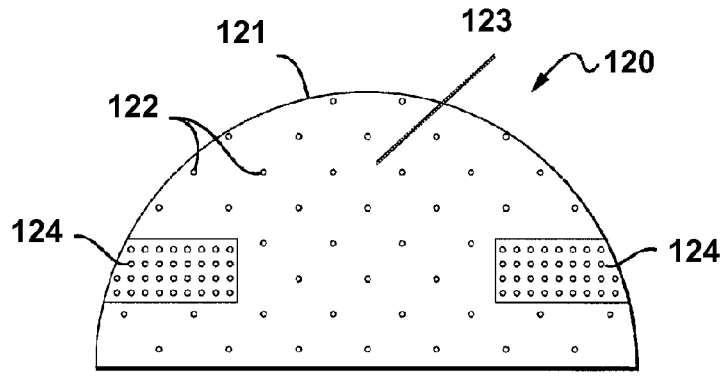
FIG._3A
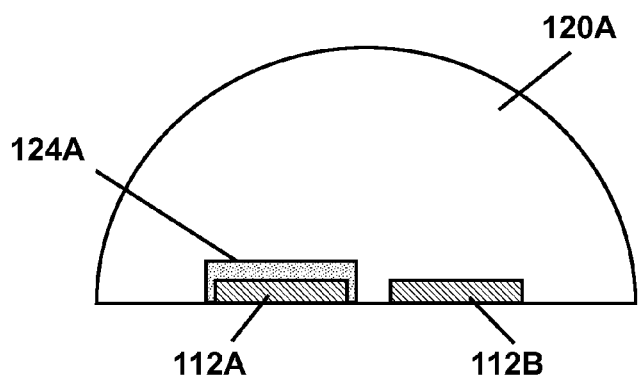
FIG._3B
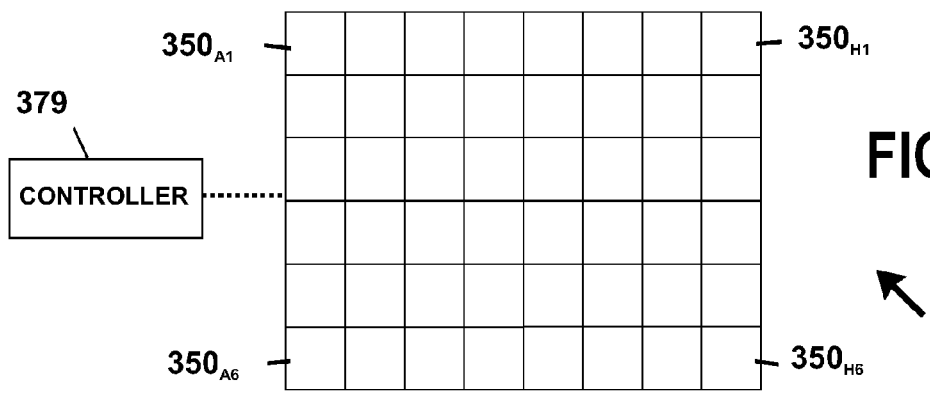
FIG._5A

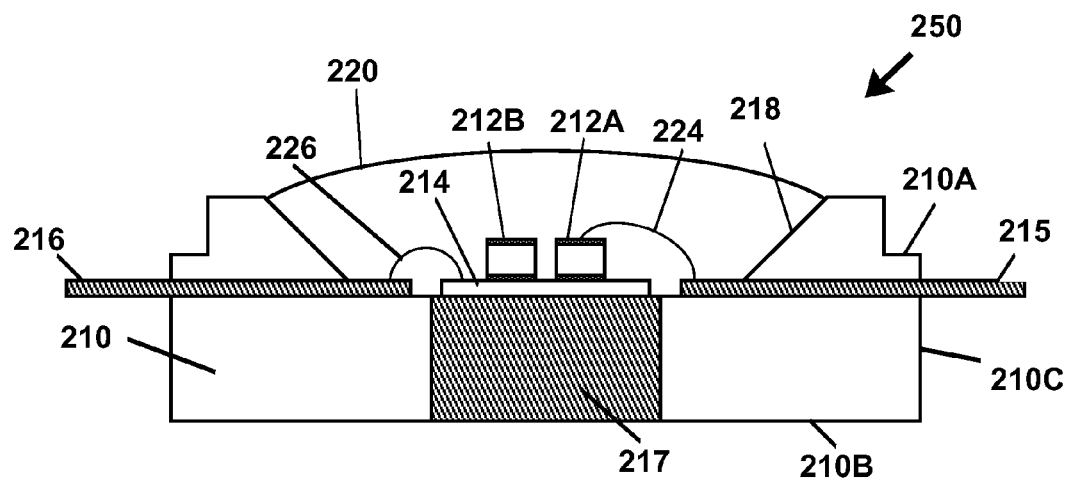
FIG._4A
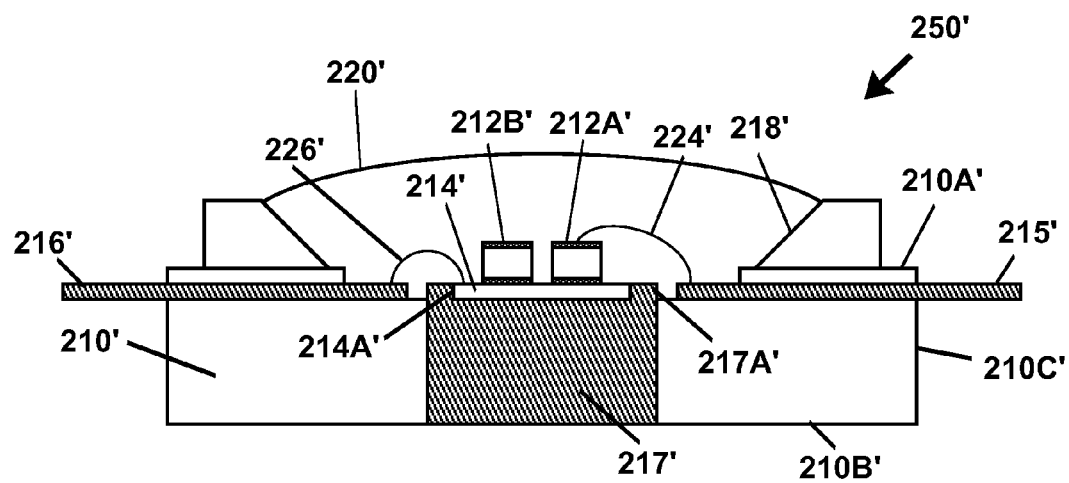
FIG._4B

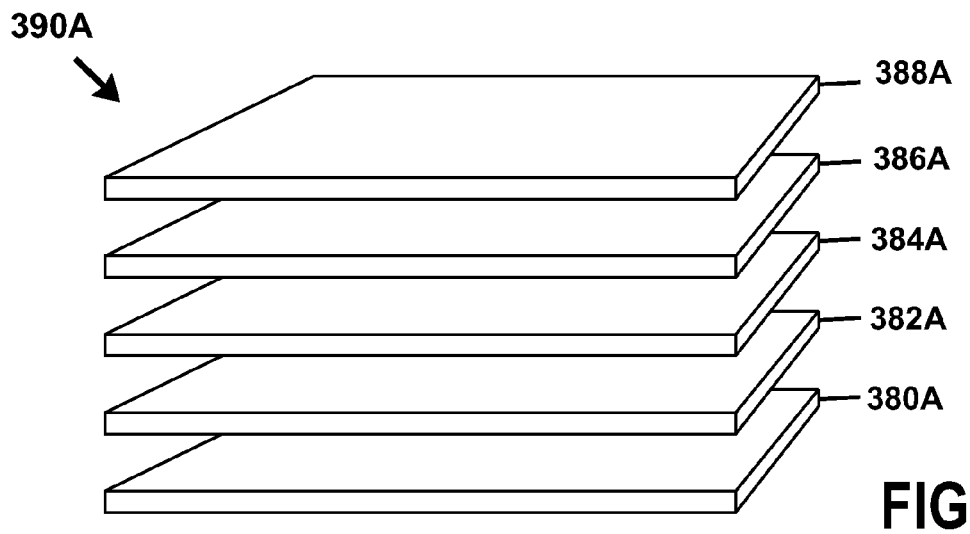
FIG._5B
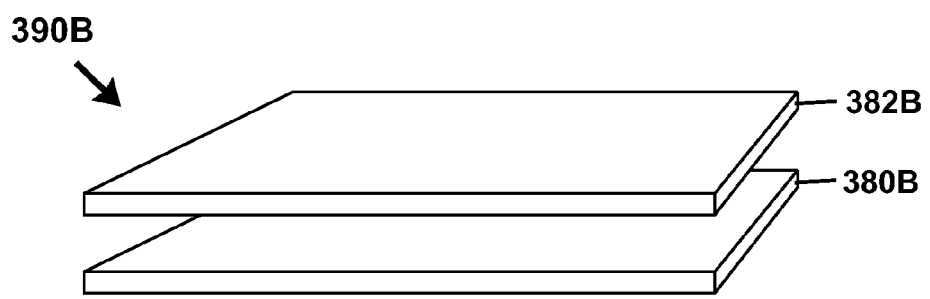
FIG._5C

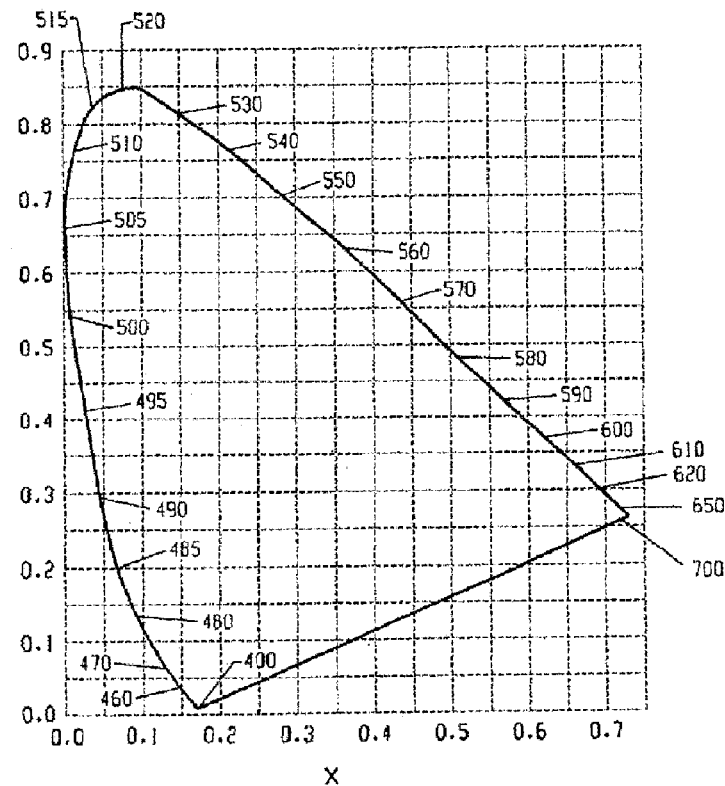
FIG._6A (PRIOR ART)
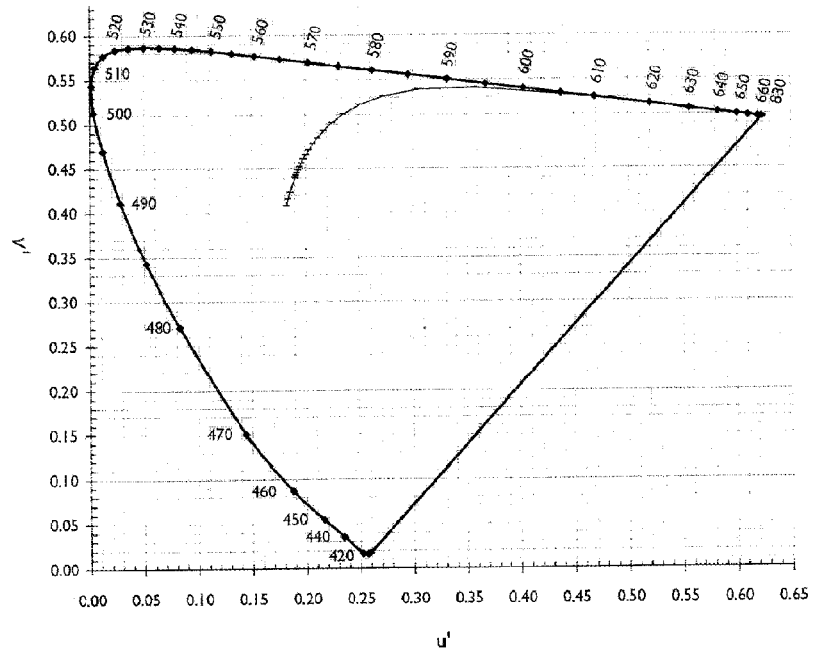
FIG._6B (PRIOR ART)

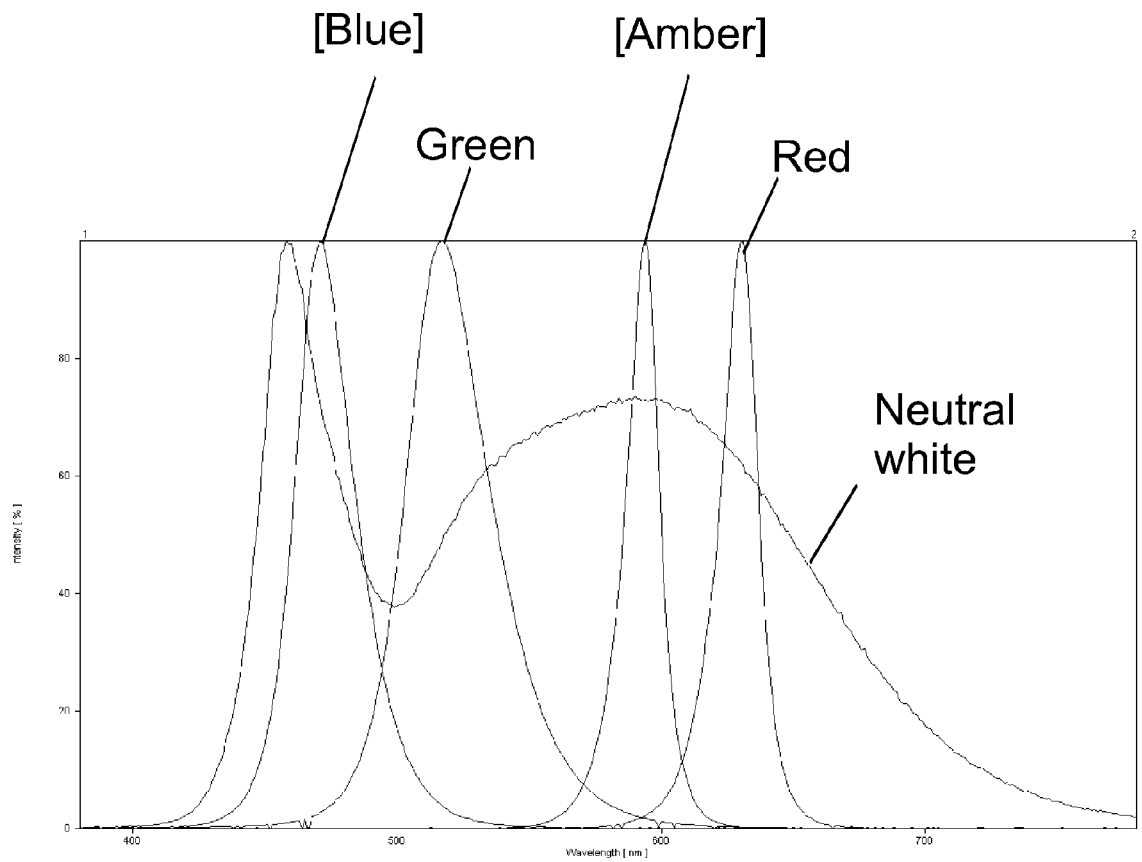
FIG._7

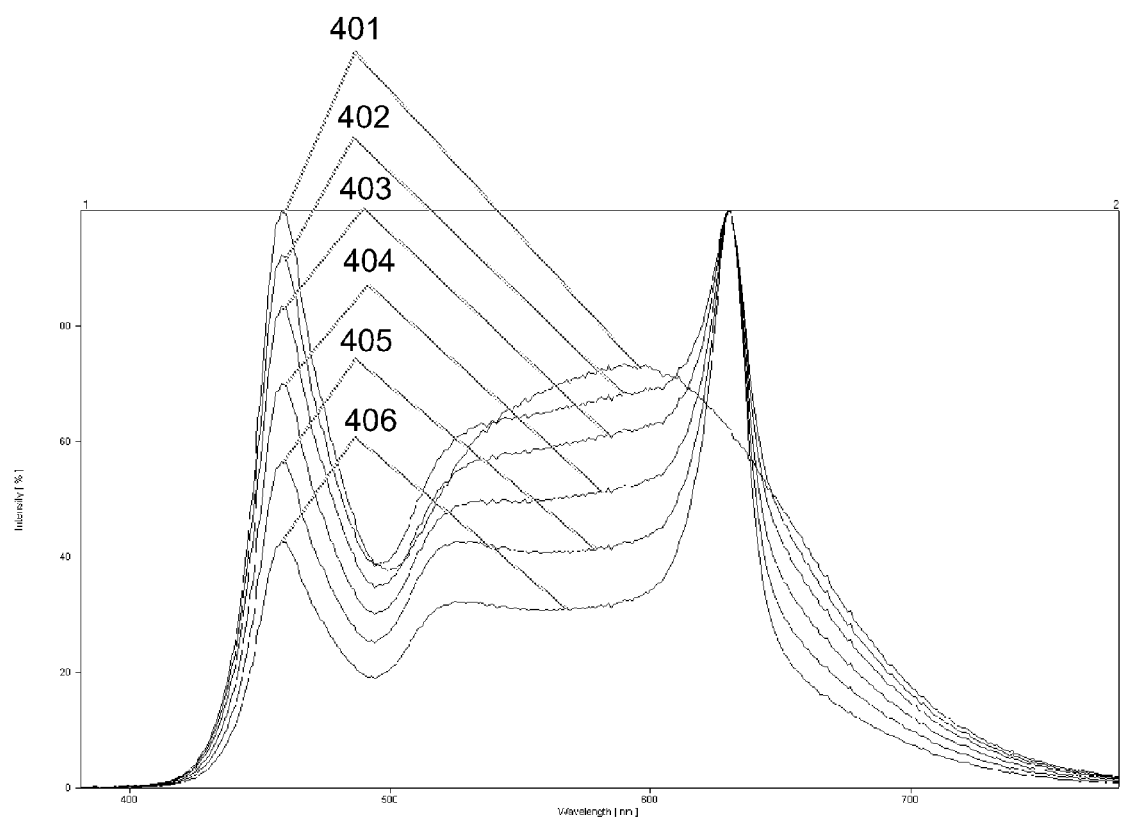
FIG._8A

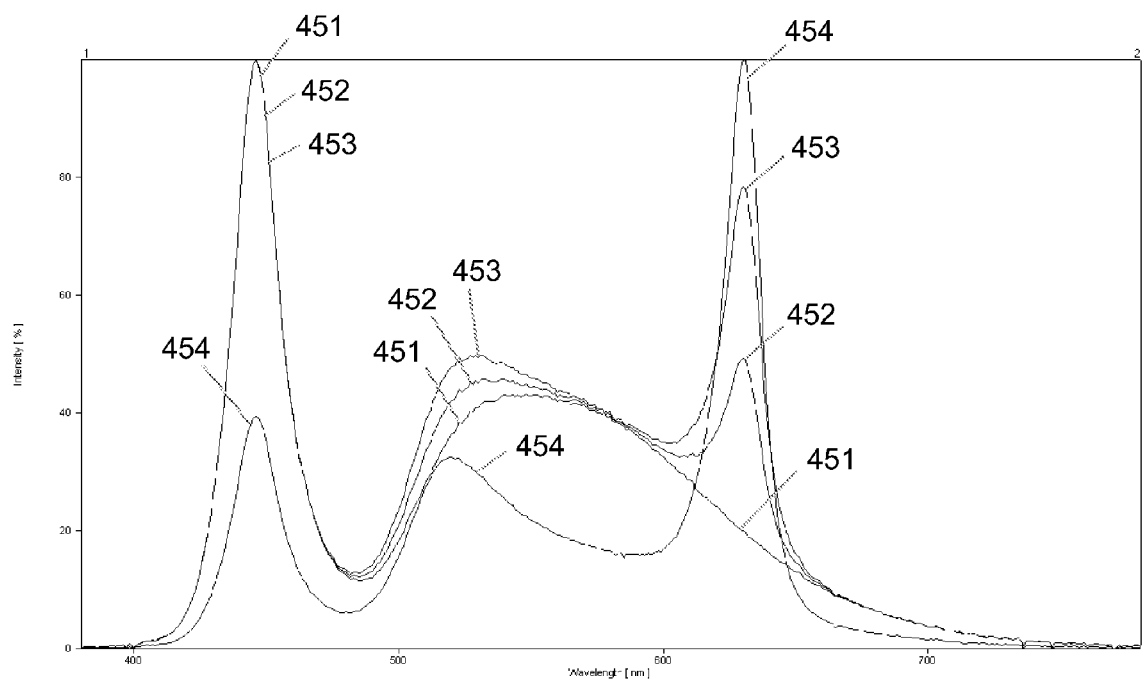
FIG._8B

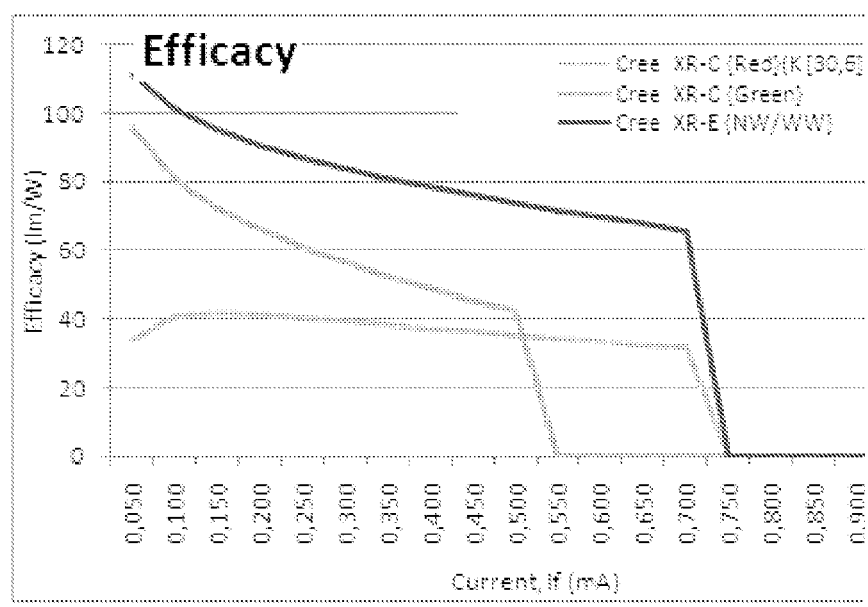
FIG._9A
FIG._9B

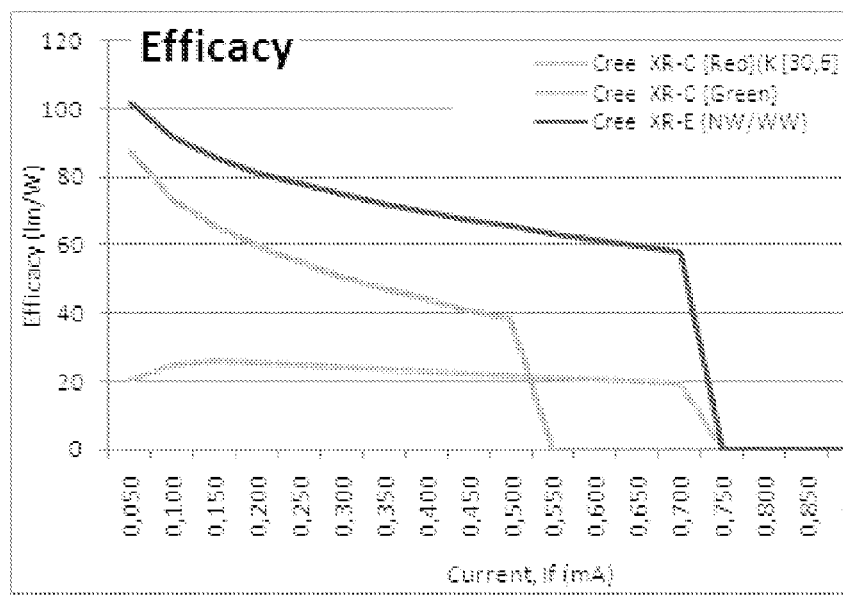
FIG._10A
FIG._10B

LIGHTING DEVICE

CROSS-REFERENCE TO RELATED APPLICATION

This application claims benefit of U.S. Provisional Patent Application No. 61/173,466 filed on Apr. 28, 2009. The disclosure of such provisional patent application is hereby incorporated by reference as if fully set forth herein.

FIELD OF THE INVENTION

The present invention relates to solid state light emitters, including packages for solid state light emitters and devices incorporating same.

DESCRIPTION OF THE RELATED ART

Solid state light sources may be utilized to provide white LED light (e.g., perceived as being white or near-white), as has been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. Part of the blue ray emitted from the blue LED chip passes through the phosphor, while part of the blue ray emitted from the blue LED chip is absorbed by the phosphor, which becomes excited and emits a yellow ray. The part of the blue light that is transmitted through the phosphor is mixed with the yellow light emitted by the phosphor. The viewer perceives the mixture of blue and yellow light as white light.

A solid state lighting device may include, for example, an organic or inorganic light emitting diode ("LED") or a laser. Examples of packages as referenced above are disclosed in U.S. Pat. Nos. 7,456,499; 7,456,499; 7,692,206; and 7,244,965, which are commonly assigned to the same assignee of the present invention.

It is known to mount solid state light sources, such as semiconductor light emitting devices in packages that may provide protection, color enhancement, focusing, and similar utilities for light emitted by a light emitting device. Packages as described in the above-referenced publications may be suitable for high power, solid state illumination applications; however, there remains a need for improved packages each including multiple LEDs (e.g., with features to enhance light output quality (e.g., color rendering index), efficiency, thermal properties, and/or controllability), and a need for improved devices incorporating such packages.

SUMMARY OF THE INVENTION

Embodiments of the present invention relate to solid state light emitters, including packages for solid state light emitters and devices incorporating same, with features for enhancing light output quality, efficiency, thermal properties, and/or controllability, as disclosed in the ensuing Detailed Description.

In a first separate aspect, the invention relates to a light emission package comprising: a first solid state emitter having a first dominant wavelength in the visible range; a second solid state emitter having a second dominant wavelength in the visible range; a third solid state emitter having a third dominant wavelength in the visible range; a fourth solid state emitter having a fourth dominant wavelength; and a first lumiphor arranged to receive emissions from the fourth solid state emitter and responsively emit a first lumiphor emission spectrum; wherein each of the first, second, third, and fourth solid state emitter is independently controllable and is disposed on or adjacent to a common submount; and wherein each of the first dominant wavelength, second dominant wavelength, and third dominant wavelength is non-coincident with the other.

In another separate aspect, the invention relates to a light emission package comprising: a first solid state emitter having a first emission spectrum in the visible range; a second solid state emitter having a second emission spectrum in the visible range; a third solid state emitter having a third emission spectrum in the visible range; and a first lumiphor arranged to receive at least a portion of the first emission spectrum and responsively emit a lumiphor emission spectrum; wherein each of the first, second, and third solid state emitter is independently controllable and is disposed on or adjacent to a common submount; and wherein the first emission spectrum has a first dominant wavelength, and the second emission spectrum has a second dominant wavelength that is non-coincident with the first dominant wavelength.

In another separate aspect, any one or more features of the foregoing aspects may be combined with other features disclosed herein for additional advantage.

BRIEF DESCRIPTION OF THE DRAWINGS

FIG. 1 is an upper perspective view of an emitter device package including four solid state emitter diodes arranged in a unitary package and capable of producing white light.

FIG. 2A is an upper perspective view of an emitter device package substantially similar to the package of FIG. 1, with a lens covering the multiple emitter diodes.

FIG. 2B is an upper perspective view of a portion of the emitter device package of FIG. 2A, showing the package without the lens to expose the emitter diodes and associated structures.

FIG. 2C is a top view of the emitter device package portion of FIG. 2B.

FIG. 2D is a bottom view of the emitter device package of FIGS. 2A-2C.

FIG. 3A is a side cross-sectional view of a lens/encapsulant portion of an emitter device package.

FIG. 3B illustrates a portion of a solid state emitter package including a lens/encapsulant portion with a scattering material arranged to interact with only one of two solid state emitters.

FIG. 4A is a side cross-sectional view of an emitter device package including multiple solid state emitters.

FIG. 4B is a side cross-sectional view of an emitter device package including multiple solid state emitters, and including a submount with at least a portion thereof being recessed into a heatsink.

FIG. 5A is a front schematic view of a controllable array of emitter device packages.

FIG. 5B is a perspective schematic assembly view of various layers of a liquid crystal-based display device including the array of FIG. 5A useable as a backlight.

FIG. 5C is a perspective schematic assembly view of various layers of a display device including the array of FIG. 5A useable to generate images.

FIG. 6A embodies the 1931 CIE Chromaticity Diagram, which is an international standard for primary colors established in 1931.

FIG. 6B embodies the 1976 CIE Chromaticity Diagram, which is an international standard for primary colors established in 1976.

FIG. 7 provides overlaid emission spectra (intensity % versus wavelength) for a neutral white XLamp® emitter device, a green LED emitter, and a red LED emitter, with spectra for blue and amber LEDs also provided for sake of comparison.

FIG. 8A provides overlaid emission spectra (intensity % versus wavelength) for a neutral white XLamp® emitter device, and combinations of the neutral white XLamp® emitter device with various numbers of red and green LED emitters.

FIG. 8B provides overlaid emission spectra (intensity % versus wavelength) for a cool white XLamp® emitter device, combinations of the cool white XLamp® emitter device with various numbers of red and green LED emitters, and a combination of a neutral white XLamp® emitter with a specific number of red and green LED emitters.

FIG. 9A is a table listing lumens, lumens/watt, forward voltage, and watts as a function of current for three red and/or green emitters (Cree XLamp® XR-C red, XR-C red, and XR-E) at 25° C.

FIG. 9B is a line chart showing efficacy (lumens/watt as a function of current) of the emitters of FIG. 9A at 25° C.

FIG. 10A is a table listing lumens, lumens/watt, forward voltage, and watts as a function of current for three red and/or green emitters (Cree XLamp® XR-C red, XR-C red, and XR-E) at 100° C.

FIG. 10B is a line chart showing efficacy (lumens/watt as a function of current) of the emitters of FIG. 10A at 100° C.

DETAILED DESCRIPTION OF THE INVENTION, AND PREFERRED EMBODIMENTS THEREOF

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide substrate such as those devices manufactured and sold by Cree, Inc. of Durham, N.C. Such LEDs and/or lasers may be configured to operate such that light emission occurs through the substrate in a so-called "flip chip" orientation.

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called lumiphoric') materials in LED devices may be accomplished by adding such materials to encapsulants, adding such materials to lenses, or by direct coating onto LEDs. Other materials, such as dispersers and/or index matching materials, may be included in such encapsulants.

Solid state emitters and lumiphors (i.e., luminescent wavelength conversion materials such as phosphors) described herein may be described as emitting individual colors. Various lumiphors are readily available and are well-known in the art. While solid state emitters and lumiphors are recognized to have relatively narrow wavelength emission ranges (e.g., a full width/half maximum wavelength spectrum of less than about 20 nm), is to be understood that assignment of individual colors to such emitters and conversion materials refer to color peaks or centers of output wavelengths. That is, individual emitters and lumiphors typically have dominant wavelengths where emissions are maximized, but an individual emitter or lumiphor may emit a range of other wavelengths (typically at substantially reduced intensity and efficiency) than its dominant wavelength. While the substantially single wavelength-concentrated emission spectrum of a particular solid state emitter diode or lumiphor may be desirable for some applications, it may not be desirable for other applications for providing general lighting utility as it does not provide high a color rendering index.

A solid state emitter as disclosed herein can be saturated or non-saturated. The term "saturated" as used herein means having a purity of at least 85%, with the term "purity" having a well-known meaning to those skilled in the art, and procedures for calculating purity being well-known to those skilled in the art.

One or more lumiphors (e.g., one or more first lumiphor(s) and one or more second lumiphor(s)) may be used in embodiments of the present invention. Each of the at least one first lumiphor and the at least one second lumiphor can individually comprise (or can consist essentially of, or can consist of) a phosphor. Each of the at least one lumiphor can, if desired, further comprise (or consist essentially of, or consist of) one or more highly transmissive (e.g., transparent or substantially transparent, or somewhat diffuse) binders, e.g., made of epoxy, silicone, glass, or any other suitable material. For example, if a lumiphor comprises one or more binders, then one or more phosphors can be dispersed within the one or more binders. In general, the thicker the lumiphor, then the lower the weight percentage of the phosphor may be.

Depending on the overall thickness of the lumiphor, the weight percentage of the phosphor could be generally any value, e.g., from 0.1 weight percent to 100 weight percent.

The following patents, patent application publications, and patent application(s) are hereby incorporated by reference, for all purposes, as if set forth fully herein:
U.S. Patent Application Publication No. 2007/0170447 to Negley, et al.;
U.S. Patent Application Publication No. 2008/0308825 to Chakraborty, et al.;
U.S. Patent Application Publication No. 2006/0221272 to Negley, et al.;
U.S. Pat. No. 5,359,345 to Hunter;
U.S. Patent Application Publication No. 2008/0198112 to Roberts;
U.S. Patent Application Publication No. 2008/0121921 to Loh, et al.;
U.S. Patent Application Publication No. 2008/0012036 to Loh, et al.;
U.S. Pat. No. 7,655,957 to Loh, et al.;
U.S. Pat. No. 7,456,499 to Loh, et al.;
U.S. Pat. No. 7,564,180 to Brandes;
U.S. Patent Application Publication No. 2007/0223219 to Medendorp, Jr., et al.;
U.S. Patent Application Publication No. 2009/0080185 to McMillan;
U.S. Pat. No. 7,213,940 to Van de Ven, et al.;
U.S. Pat. No. 7,095,056 to Vitta, et al.; and
U.S. patent application Ser. No. 12/756,725 to Kim, et al.

Referring now to FIG. 1, a solid state light emitter package 50 according to some embodiments of the present invention includes four independently controllable (e.g., addressable) solid state emitters 12A-12D arranged over (i.e. on or adjacent to) a common submount 14 and a common leadframe 11. The package 50 includes a molded package body 10 surrounding or at least partially encasing the leadframe 11 and a lens 20 mounted over a central region of the package 50. Conductive traces 19 provided on or over the submount 14, and wirebonds 18, provide electrically conductive paths between the emitters 12A-12D and electrical leads 15A-15D and 16A-16D extending from sides of the package body 10. Double wirebonds 18 may be used as desired to facilitate even distribution of electrical current and reduce heating of the wires. The leads 15A-15D, 16A-16D may be arranged such that leads of opposite polarity type (e.g., anodes or cathodes) are provided on opposite sides of the package body 10, which may facilitate the connection of packages using such leadframes in series. Registration features or molding depressions 8A-8D may be provided adjacent to corners of the in the package body 10. A peripheral reflector 21 may be provided below the lens 20. Any of various optional features, such as mixers, diffusers, etc., may be provided in addition to or instead of the lens 20.

The package 50 may have length and width dimensions of 7.0 mm×9.0 mm, inclusive of the leads 15A-15D, 16A-16D following crimping/trimming thereof. Each emitter of the four emitters 12A-12D disposed in the unitary package may be arranged with lateral edge spacing of less than about 1.0 mm, more preferably less than about 0.5 mm, more preferably still less than about 0.2 mm from at least one adjacent emitter. Such close lateral spacing is desirable to approximate a point source, and thereby minimize perception of discrete color sources when multiple emitters of different colors are operated simultaneously—thus promoting color mixing and shadow reduction. Each solid state emitter 12A-12D may have a top emissive surface (facial) area of about 1.0 mm$^2$. Given the presence of four solid state emitters 12A-12D, the ratio of solid state emitter top emissive surface or facial area to total facial package area (of about 63 mm$^2$) is about 4/63, or about 6.3%. In an alternative embodiment, one or more emitters may have a top emissive surface (facial) area of at least about 1.4 mm$^2$; assuming the presence of four such emitters in the same overall facial package area (about 64 mm$^2$), the ratio of solid state emitter top emissive surface or facial area to total facial package area is at least about 5.6/63, or at least about 8.9%. Multi-emitter packages with integral leadframes, and optionally including integral ESD devices, in similar embodiments may be characterized by ratios of solid state emitter top surface (facial) area to total top surface (facial) package area of preferably at least about 4%, more preferably at least about 5%, more preferably at least about 6%, more preferably at least about 7%, more preferably at least about 8%, more preferably at least about 9%, and still more preferably at least about 10%. In a multi-emitter package as described herein, at least one or each different color solid state emitter (e.g., red, blue, or green) or different solid state emitter/lumiphor combination (e.g., blue emitter/yellow phosphor combination) preferably has a ratio of solid state emitter top surface area or facial area to overall package top facial area of at least about 1/63 (or about 1.6%), more preferably at least about 1.4/63 (or about 2.2%). In one embodiment, such a package is configured with multiple (e.g., three) solid state emitters of different colors (dominant wavelengths) and at least one lumiphor-converted solid state emitter (e.g., to produce white light or light of any suitable color or dominant that may be different from (or substantially the same as) one or more of the other solid state emitters.

Presence of an independently controllable white die (e.g., comprising a blue solid state emitter and yellow lumiphor) in addition to independently controllable red, green, and blue dies in the same package can provide higher flux and selected white chromaticity (e.g., using the white die) in addition to any color that may be generated by the RGB combination (or subsets thereof). Such arrangement provides design flexibility for applications requiring color changing with high flux from compact lighting sources. Each emitter of a multi-emitter package as disclosed herein is preferably closely spaced to provide enhanced color mixing and shadow reduction for color-based applications (e.g., decorative lighting, architectural lighting, and entertainment lighting). In one embodiment, an entertainment light provides spinning color with high flux. In another embodiment, a color changing light bulb or color changing luminaire includes at least one package, and preferably multiple packages as disclosed herein. Such a color changing light bulb may be of any suitable type, including, but not limited to, R16, MR16, MR16A, and MR16B bulb types.

In one embodiment, a solid state light emitter package includes at least one solid state light emitter package including at least two non-white independently controllable solid state emitters (e.g., red, green, blue, cyan, amber) and at least one independently controllable solid state emitter in combination with a lumiphor arranged to output white light. Multiple independently controllable non-white solid state emitters and multiple independently controllable white emitters (e.g., each comprising a solid state emitter and a lumiphor) may be provided in a single package. Of the multiple white emitters, a first white emitter may be adapted to output one of cool white, neutral white, or warm white, and a second white emitter may be adapted to output a different one of cool white, neutral white, or warm white. Independent operation of different white emitters permits the device to selectively output white light with different color temperatures. White light from different white emitters may be emitted simultaneously or at different times, and may be supplemented with emissions from one or multiple non-white solid state emitters.

In one embodiment, a solid state light emitter package includes independently controllable red, green, blue, and white emitters (e.g., with the red, green, and blue emitters ("RGB" in combination) comprising solid state emitters, and the white emitter including a blue emitter combined with a yellow lumiphor, or other suitable white emitter). The white emitter may be cool white, neutral white, or warm white. Dominant wavelength ranges, flux at 350 milliamps, increase multipliers to extrapolate performance from 350 to 700 milliamps, and flux at up to 700 milliamps for each of the foregoing emitters and packages comprising same (e.g., RGB plus cool white, RGB plus neutral white, and RGB plus warm white) are set out in the following Table 1.

| Emitter | Dominant wavelength range | | Flux @ 350 mA | | Flux @ up to 700 mA | |
|---|---|---|---|---|---|---|
| | Min | Max | Min. | Max | Increase multiplier | Max |
| Red | 620 | 630 | 30.6 | 56.8 | 1.8 | 102.2 |
| Green | 520 | 535 | 67.2 | 107 | 1.58 | 169.1 |
| Blue | 450 | 465 | 8.2 | 23.5 | 1.68 | 39.5 |
| White | Cool white | | 95 | 114 | 1.73 | 197.2 |
| | Neutral white | | 80 | 100 | 1.73 | 173.0 |
| | Warm white | | 70 | 80.6 | 1.73 | 139.4 |
| TOTAL | | | | | RGB plus cool white | 508.0 |
| | | | | | RGB plus neutral white | 483.8 |
| | | | | | RGB plus warm white | 450.2 |

Although Table 1 includes flux values for currents of up to 700 milliamps, in further embodiments any one or more of the emitters (RGB and/or white) may be operated at currents of 700 milliamps or more, with flux values of at least (i.e., equal to or greater than) the maximum values recited in the rightmost column of Table 1. The emitters may also be operated at currents lower than 700 milliamps, including currents of 350 milliamps or lower. In various embodiment, a light emission package as disclosed herein and including white, red, green and blue ("WRGB") emitters has a total lumen output of preferably at least about 300 lumens, more preferably at least about 350 lumens, more preferably at least about 400 lumens, more preferably at least about 450 lumens, more preferably at least about 480 lumens, more preferably at least about 484 lumens, more preferably at least about 500 lumens, and more preferably at least about 505 lumens.

The leadframe 11 preferably comprise a thermally conductive material (e.g., a metal) that may or may not be electrically active. The submount 14 may comprise a thermally conductive but electrically insulating material (e.g., aluminum nitride, ceramic, etc.). The submount 14 may be attached to the leadframe 11 using any conventional method, including use of a thermally conductive paste. Given the electrically insulating character of a preferred submount, traces 19 and wirebonds 18 may be provided to establish electrically conductive paths to and from the solid state emitters 12A-12D. Electrostatic discharge protection (ESD) devices 13A-13D such as zener diodes (or, alternatively, ESD devices such as ceramic capacitors, transient voltage suppression (TVS) diodes, multilayer varistors, and/or Schottky diodes) are integral to the package 50, and arranged over the submount 14 to protect the solid state emitters 12A-12D from harmful electrostatic discharge. In the illustrated embodiment, each solid state emitter 12A-12D has an associated ESD device 13A-13D. In another embodiment (e.g., if multiple emitters 12A-12D should be connected in series), each separately addressable path or separate conductive path through the device 50 includes an associated ESD device 13A-13D. Each ESD device 13A-13D may be surface mounted on the submount 14. A thermally conductive heatsink (e.g., metal or other conductive slug) is preferably provided below and in thermal communication with the submount 14 (e.g., via the leadframe 11) to conduct heat away from the solid state emitters 12A-12D to a bottom side of the package 50. The heatsink is preferably electrically inactive, and may be rendered so through use of an electrically insulating submount. The heatsink may be integrally formed with the leadframe (e.g., as a portion of the leadframe of a thicker gauge or otherwise enhanced mass and/or thickness), or a heatsink may be placed proximate to the leadframe, according to any suitable manufacturing process. If a submount is provided, the heatsink is preferably longer and/or wider than the submount to enhance lateral dispersion of heat emanating from the solid state emitters.

In one embodiment, the submount 14 may be eliminated, with the emitters 12A-12B (and optional ESD devices 13A-13D) being mounted on or over a leadframe 11. The leadframe may or may not be electrically active. If desired to electrically isolate part or all of the leadframe, an electrically insulating material (e.g., thin film or selectively patterned area) may be arranged between the leadframe and the emitters, with electrical traces and/or wirebonds included to provide electrical connection to the emitters and/or ESD devices. 13A-13D. Alternatively, or additionally, an electrically insulating material may be disposed between at least a portion of the leadframe and an underlying heatsink or slug to promote electrical isolation of the heatsink or slug. In another embodiment, solid state emitters (with optional ESD devices) may be mounted on or over a heatsink or slug. The heatsink or slug may be electrically active and used as a bottom side contact for devices mounted thereon, with an electrically insulating material optionally being arranged below the heatsink or slug. Alternatively, or additionally, an electrically insulating material may be disposed or selectively patterned between the heatsink or slug and the emitters arranged thereon.

The individually controllable solid state emitters may be driven with any appropriate level of current. In one embodiment, each emitter is adapted to be driven with a current of up to at least about 700 mA. Spectral output from the emitters in combination may include cool white (e.g., from about 5,000 K to about 10,000 K), neutral white (e.g., from about 3,700 K to about 5,000 K), and/or warm white (e.g., from about 2,600 K to about 3,700 K). Viewing angle is preferably at least about 110 degrees (full width-half max). Typical forward voltage may be from about 2.8V to about 3.4 V over a current range from about 50 mA to about 700 mA.

In some embodiments as disclosed herein, a mixture of light would have a color rendering index of at least 80, in some cases at least 83, in some cases at least 85, in some cases at least 90, and in some cases at least 92.

In one embodiment, the emitters 12A-12D include a red LED 12D, a blue LED 12B, a green LED 12C, and a blue LED 12A having an associated yellow phosphor—with the blue LED 12A/yellow phosphor combination arranged to emit white light. Each solid state emitter 12A-12D is independently controllable via different pairs of the leads 15A-16A, 15B-16B, 15C-16C, 15D-16D. The package 50 may therefore be operated in the following modes: (1) to generate white light by operating the blue LED 12B/yellow phosphor combination alone; (2) to generate white light by operating all LEDs 12A-12D simultaneously (thereby emitting white light from the blue LED 12A/yellow phosphor combination, and white light from the combination of the red LED 12D, blue LED 12B, and green LED 12C; (3) to generate red light by operating the red LED 12D alone; (4) to generate blue light by operating the blue LED 12B alone; (5) to generate green light by operating the green LED 12C alone; and (6) color-adjusted combinations of the foregoing (e.g., by manipulating current to one or more of the four LEDs 12A-12D. Additional possible operating modes useable with the package 50 are disclosed in U.S. Patent Application Publication No. 2009/0080185 to McMillan, which is incorporated by reference. Solid state emitter packages as described herein may be combined with any one or more features of the foregoing patent application publication to McMillan.

Although the emitters 12A-12D have been described herewith as embodying a specific combination of solid state emitters and a lumiphor, it is to be appreciated that any desired numbers and colors of solid state emitters and lumiphors may be employed, as will be recognized by one skilled in the art.

The terms "multi-emitter package" or simply "emitter package" as used herein refers generally to a light emission device including multiple solid state emitters in conjunction with at least one of a common leadframe, a common submount, and a common reflector.

The submount 14, over which the solid state emitters 12A-12D are disposed, may constitute an electrically insulating material and have associated electrically conductive traces to facilitate electrical connection to the emitters. The submount 14 may also be arranged over (e.g., directly on), on an underlying substrate, which may be electrically insulating or conductive in character. Alternatively, the solid state emitters 12A-12D may be disposed over or directly on portions of a leadframe serving as medial extensions of the electrical leads 15A-15D, 16A-16D. The package body 10 (e.g., formed of an insulating material such as a polymer and/or composite) may be molded around the electrical leads 15A-15D, 16A-16D and any associated leadframe, with the package body 10 in conjunction with the lens 20 preferably serving to isolate conductive structures within the package 50 from above and below, such that the only externally accessible electrically conductive paths to the package 50 embody the electrical leads 15A-15D, 16A-16D.

FIGS. 2A-2D depict an emitter device package 50' substantially similar to the package 50 illustrated and described in connection with FIG. 1. The package 50' includes four solid state emitters 12A'-12D' arranged over a common submount 14' and a common leadframe 11'. The package 50' includes a molded package body 10' surrounding the submount 14' and a lens 20' mounted over a central region of the package 50'. Conductive traces 19' provided on or over the submount 14', and wirebonds 18', provide electrically conductive paths between the solid state emitters 12A'-12D' and electrical leads 15A'-15D' and 16A'-16D' extending from sides of the package body 10'. The leads 15A'-15D', 16A'-16D' may be arranged such that leads of opposite polarity type (e.g., anodes or cathodes) are provided on opposite sides of the package body 10'. Registration features or molding depressions 8A'-8D' may be formed adjacent to corners of the package body 10'. A peripheral reflector 21' may be provided below the lens 20'. A thermally conductive heatsink or slug 17' (optionally integrated and/or integrally formed with the leadframe 11') is exposed along a back side of the package 50' and is in thermal communication with the submount 14' to conduct heat away from the solid state emitters 12A'-12D'. The heatsink or slug 17' preferably has an exposed surface area that is larger than a facial area of the submount 14'.

Construction details for, and features of, packages including multiple solid state emitters are disclosed in the following U.S. patents and published patent applications: U.S. Patent Application Publication No. 2008/0121921 to Loh, et al.; U.S. Patent Application Publication No. 2008/0012036 to Loh, et al.; U.S. Pat. No. 7,655,957 to Loh, et al.; and U.S. Pat. No. 7,456,499 to Loh, et al. Solid state emitter packages as described herein may be combined with any one or more features of the foregoing U.S. patent and U.S. patent application publications to Loh et al., including, but not limited to: dual thickness leadframe construction; general electrical trace patterns; and materials and methods of fabrication of various components.

It is to be appreciated that the foregoing packages 50, 50' may be modified to include any desirable number of solid state emitters of any color(s) or combinations thereof. One package may include at least one solid state emitter adapted to emit a first color that is devoid of a lumiphor (e.g., phosphor), and at least one solid state emitter adapted to emit of a second color with an associated lumiphor that is preferably adapted to emit a third color. One, two, or preferably all three of the first through third colors may be in the visible range. Such colors preferably have non-coincident dominant wavelengths. Another package 50, 50' may include at least two solid state emitters of different colors that are devoid of lumiphors, with and at least two solid state emitters having associated lumiphors of different colors, with the package being arranged to emit preferably at least three, more preferably at least four, and possibly five or even six or more different colors. Emissions from a solid state emitter having an associated lumiphor may be fully absorbed by the lumiphor (for responsive conversion to another wavelength), or only partially absorbed, such that a solid state emitter and lumiphor in combination may be adapted to emit one color peak or two color peaks (with each color peak preferably being in the visible range).

In one embodiment, a solid state emitter package (e.g., packages 50, 50') such as described above includes multiple lumiphors in addition to multiple solid state emitters. For example, with comparison to the embodiment of FIG. 1, at least two different LEDs 12A-12D may be coated with different lumiphors (e.g., phosphors). Alternatively, multiple lumiphors arranged to interact with emitters of different colors may be combined, and such combination may be coated (e.g., conformally coated) or otherwise disposed over at least two, at least three, or at least four solid state emitters 12A-12D. For example, multiple lumiphors may be combined with an encapsulant and/or coated on or integrated with a lens, with the multiple phosphors being arranged to interact with one solid state emitter, two solid state emitters, or three or more solid state emitters. Various combinations of multiple lumiphors and multiple solid state emitters are described, for example, in U.S. Pat. No. 7,564,180 to Brandes, and U.S. Patent Application Publication No. 2007/0223219 to Medendorp, et al., which are incorporated by reference herein. Output wavelength spectra may include, for example, warm white light with high color rendering index, or color temperatures in any one of the following regimes: (A) white light having a color temperature in a range of from 1350° K. to 1550° K.; (B) white light having a color temperature in a range of from 2400° K. to 3550° K.; or (C) white light having a color temperature in a range of from 4950° K. to 6050° K. As further specific examples, the color temperature of candles is ~1500° K., the color temperature of incandescent bulbs is ~2680-3000° K., the color temperature of sunrise and sunset is ~3200° K., and the color temperature of a sunny day at noon is ~5500° K. By appropriate selection of LED die components and phosphor species, a close approach to the color temperature of interest can be achieved in the light output of the light emission device). Sizes (e.g., emissive area or frontal area) and/or numbers of individual emitters disposed within a multi-emitter package may be varied to at least partially compensate for performance differences among emitters of different colors, as described in U.S. Pat. No. 7,564,180 to Brandes. For example, green LEDs are known to operate at lower efficiency than comparable blue and red emitters; accordingly, the number and/or size of one or more green LEDs may be larger than the number and/or size of corresponding red and blue emitters in a single package, to overcome potential green light deficiency and provide more balanced white light from a composite of red-green-blue (RGB) solid state emitters. Solid state emitter packages (e.g., packages 50, 50') as described herein may be combined with any one or more features as described in U.S. Pat. No. 7,564,180 to Brandes. Likewise, solid state emitter packages (e.g., packages 50, 50') as described herein may be combined with any one or more features as described in U.S. Patent Application Publication No. 2007/0223219 to Medendorp, et al.

Any of various sensors may be integrated into, or used on conjunction with, a package 50, 50' to generate output signals indicative of package operation, with such signals being useable to responsively control the package 50, 50'. In one embodiment, one or more temperature sensors may be integrated into the package at any desirable location to generate a signal indicative of temperature, thermal flux, and/or excess heating, and such signal may be used to responsively limit supply of electrical current to the package and/or initiate responsive cooling such as with an integrated or external cooling device (not shown), using any appropriate thermal transport method (e.g., convective, conductive, and/or radiative cooling) with one or more cooling devices such as fans, pumps, heatpipes, thermoelectric coolers, etc. In one embodiment, one or more light sensors may be integrated into, or used in conjunction with, a package 50, 50' to sense quantity and/or color of emitted radiation, and generate output signals that may be used to responsively control operation of the package. In one embodiment, multiple emitter packages (e.g., of the type of packages 50, 50') may be used in combination, such as in an array, to provide backlighting utility for a display (e.g., a LCD display), including use of one or more (preferably several) light sensors for responsive control of individual emitter packages or groups of emitter packages to facilitate uniform backlighting of a display that is substantially larger (e.g., wider and taller) than an individual emitter package. Such sensing utility may be beneficial to compensate for differential degradation of lighting performance of multiple emitters due to aging thereof. In one embodiment, light sensors may be used to sense color output by one or more packages 50, 50', with output signals being used to responsively adjust and/or correct color output to achieve a desired light quality and/or improved color rendering index.

Emitter packages as disclosed herein (e.g., packages 50, 50') may be integrated with or associated with light mixing elements and/or light devices of various types. In one embodiment, spectral content of an emitter package (e.g., packages 50, 50') may be shifted by the inclusion of spatially separating lumiphors (e.g., lumiphor films), as disclosed in U.S. Patent Application Publication No. 2007/0170447 to Negley, et al., which is incorporated by reference. First and second lumiphors (e.g., lumiphor films, lumiphor coatings, and/or lumiphor dispersions) are spaced from one another. Preferably, at least one second lumiphor is spaced apart from, and outside of, at least one first lumiphor relative to at least one solid state emitter. Such shifting is preferably accomplished to provide combined emission with improved color rendering index. The presence of spaced-apart lumiphors provides enhanced color mixing, as may be beneficial for use with an emitter package including plural solid state emitters arranged to emit different colors, so as to minimize perception of simultaneous emission of distinct colors. Solid state emitter packages (e.g., packages 50, 50') as described herein may be combined with any one or more features as described in the foregoing U.S. Patent Application Publication No. 2007/0170447 to Negley, et al.

In certain embodiments, emitter packages (e.g., packages 50, 50') as described herein may be enhanced and/or tuned using light scattering materials that are arranged in configurations that are non-uniform relative to the emitters as a group, and/or relative to individual emitters, as disclosed by U.S. Patent Application Publication No. 2008/0308825 to Chakraborty, et al. As indicated previously, it is desirable to place emitters of different colors in close proximity to one another to approximate a point source, and thereby minimize perception of discrete color sources when multiple emitters of different colors are operated simultaneously. Emitter packages as disclosed herein that include multiple emitters (or emitters and emitter/phosphor combinations) of different colors (e.g., emitters 12A-12D of FIG. 1) may be operated in combination to generate light that is perceived at white (or a desired color mix) when a viewer is directly facing the package (e.g., substantially perpendicular to an upper surface of the package body 10), but discrete colors of light (rather than white or another desired color mix) might be perceived by a viewer facing the package from the side (e.g., substantially parallel to an upper surface of the package body 10) or at an angle. To overcome this effect without unduly reducing light intensity emitted perpendicular to an upper surface of the package body 10, one or more scattering elements (e.g., scattering elements dispersed in encapsulant) may be arranged to interact with light that would otherwise emanate from the package at a shallow angle, while light emanating from the emitters in a direction perpendicular to the upper surface of the package body 10 may interact with a reduced concentration (e.g., low concentration or zero concentration), or different type, of scattering elements.

FIG. 3A represents a lens/encapsulant portion 120 that may be substituted for the lenses 20, 20' as described hereinabove in connection with FIG. 1 and FIGS. 2A-2D, respectively, with the lens/encapsulant portion 120 embodying light scattering materials that are arranged in a configurations that is non-uniform relative to underlying emitters (e.g., emitters 12A-12D or 12A'-12D'). Such portion 120 may or may not include a dedicated lens overlying an encapsulant. The lens/encapsulant portion 120 includes a first type of scattering elements 122 or first concentration of scattering elements 122 dispersed in an encapsulant, and includes a second type of scattering elements 124 or a second concentration of scattering elements 124 arranged in an annular shape (defining a central aperture 123) adjacent to the base of the lens/encapsulant portion 120. Such arrangement permits light emanating from emitters in a direction perpendicular to an upper surface of a package body to travel from underlying emitters through the aperture 123 and interact only with the first type or first concentration of scattering elements 122. In contrast, light emanating from underlying emitters at a significant angle relative to perpendicular will interact with the second type or concentration of scattering elements 124 arranged in the annular shape. The second type or (high) concentration of scattering elements 124 are arranged to promote mixing and/ or diffusion of light of different colors emanating from different underlying emitters and/or lumiphors, thereby avoiding inconsistent appearance. In one embodiment, the first scattering material 122 may be omitted altogether, such that only the second scattering material 124 is present. Various non-uniform shapes and configurations for scattering, mixing, and/or dispersion elements disclosed in U.S. Patent Application Publication No. 2008/0308825 to Chakraborty, et al. may alternatively be used. As an enhancement or alternative to the foregoing scattering elements 124, one or more surface modifications (e.g., ridges, patterns, etc.) may be provided along an outer surface 121 of the lens 120, along an interior surface of the lens 120, and/or disposed intermediately between the emitters and the outer surface 121. Solid state emitter packages (e.g., packages 50, 50') as disclosed herein may be combined with any one or more features as described in the foregoing U.S. Patent Application Publication No. 2008/0308825 to Chakraborty, et al.

FIG. 3B depicts a portion of a solid state emitter package including a lens/encapsulant portion 120A and solid state emitters 112A, 112B with a scattering material 124A arranged to interact with only one solid state emitter 112A.

In one embodiment, a solid state emitter package may include a submount having enhanced thermal exchange properties. Referring to FIG. 4A, an emitter package 250 includes multiple emitters 212A, 212B (e.g., LED chips manufactured by Cree, Inc., Durham, N.C.) having integral conductive substrates. Such solid emitters 212A, 212B may be vertical devices including anode and cathode contacts on opposing faces, respectively. In the embodiment illustrated in FIG. 4A, the solid state emitters 212A, 212B are mounted in a flip-chip configuration, with light emitting upward through substrates of the emitters 212A, 212B. Either or both of the emitters 212A, 212B may be arranged to interact with lumiphors, which may be coated on or over the emitters 212A, 212B or dispersed in an encapsulant 220 which may optionally include an associated lens (not shown). Wirebond connections 224, 226 may connect external leads 215, 216 with conductive traces on the submount 214, and/or additional wirebond connections (not shown) may be provided. The submount 214 and emitters 212A, 212B are arranged in a reflector cup 218 positioned on an upper surface 210A of (or optionally integrated with) a package body structure 210. The body structure 210 preferably comprises an electrically insulating material such as a molded polymeric composition. Disposed within a central portion of the body 210 is a heatsink 217, which extends between the submount 214 and a lower surface 210B of the body 210. The heatsink 217 may be integrally formed with, or joined to, a leadframe. A similar solid state emitter package and fabrication details regarding same are provided in U.S. Pat. No. 7,655,957 to Loh, et al., which is incorporated by reference herein.

Submounts for solid state emitters are conventionally fabricated of electrically insulating ceramic materials. Aluminum nitride may also be used for at least a portion of a submount. When multiple solid state emitters are disposed on a common submount, and particularly when such emitters are disposed close to one another, thermal management becomes a challenge. Portions of a submount disposed between multiple emitters are subject to receive heat from each of multiple emitters, resulting in localized 'hot spots' in the submount as the underlying heat sink may not be able to disperse heat away the hot spots as quickly as such heat is received from the emitters. Spatially segregating solid state emitters to mitigate localized heat transfer issues is not a desirable solution, because such segregation would inhibit color mixing when emitters and/or emitter-lumiphor combinations of multiple colors are used.

A solution to the foregoing localized heat transfer problem associated with use of multiple emitters arranged closely to one another on a common submount is to provide a submount (e.g., submount 214 in FIG. 4A) with an anisotropic heat spreader. One example of such an anisotropic heat spreader is a graphite foil or other graphite layer. Such material is characterized by enhanced lateral heat transfer, as is useful to conduct heat away from regions along boundaries of adjacent solid state emitters and thereby prevent hot spots from forming in the submount. If the anisotropic heat spreader should not provide sufficient electrical insulating utility, then the submount 214 may be fabricated of an anisotropic material sublayer covered with a suitably thin electrically insulating layer such as aluminum nitride. Given a relatively constant rate of vertical heat transfer through the heat sink 217, by rapidly spreading heat in a lateral direction with an anisotropic heat spreader, temperature differences across the width of the submount 215 (and the underlying heat sink 217) may be reduced, and operational efficiency of the heatsink 217 may be improved. Because life of a solid state emitter may be shortened through operation at excessively high temperatures, elimination of hot spots in the submount 214 promotes enhanced operating life of solid emitters 212A-212B in a multi-emitter package 250. It is to be appreciated that the submount 214 may be omitted if desired as described hereinabove, with the emitters 212A, 212B disposed over a leadframe and an anisotropic heat spreader arranged over a heatsink. Alternatively, a leadframe may be formed with an integral portion (e.g., a center section) serving as an anisotropic heat spreader in thermal contact with a heatsink.

Heat transfer from a submount (or a leadframe) having an associated or integral anisotropic heat spreader may be further enhanced by providing lateral contact between the anisotropic heat spreader and an associated heatsink FIG. 4B illustrates a solid state emitter package 250' similar to the package 250 described in FIG. 4A, but with a submount 214' arranged in a recess within a heatsink 217', such that a sidewall portion 214A' of the submount 214', including an anisotropic heat spreader along at least the bottom face of the submount 214' to contact the sidewall portion 214A', is in thermal contact with the heatsink 217. Such contact may be enhanced with thermally conductive paste. Because the anisotropic heat spreader has enhanced lateral thermal conduction, providing thermal contact between the anisotropic heat spreader and an upwardly-extending lip portion 217A' of the heatsink 217' facilitates more rapid dissipation of heat away from a central portion of the submount between the emitters 212A', 212B' and minimizes generation of hot spots. The package 250' is otherwise similar to the package 250 described hereinabove: electrical leads 215', 216' and a leadframe are disposed in a body 210' (having an upper face 210A', lower face 210B', sides 210C', and an associated reflector cup portion 218'), and wirebonds 224', 226' facilitate electrical contact to the emitters 212A', 212B' encapsulated with an encapsulant 220'.

In certain embodiments, one or more (preferably several) solid state emitter packages (e.g., packages 50, 50' each including multiple emitters) as disclosed herein may be incorporated into or utilized with display devices (such as LCD-based displays) adapted to reproduce images, text, and the like. Such solid state emitter packages may be used, for example, to provide backlighting utility. Referring to FIG. 5A, multiple solid state emitter packages $350_{A1}$-$350_{H6}$ may be disposed in a two-dimensional array 380. (Although forty-eight packages are illustrated in the array 380, it is to be understood that an array may include any desirable number of packages, with desirable arrays including packages numbering at least one hundred, at least four hundred, at least two thousand five hundred, at least ten thousand, at least forty thousand, at least two hundred fifty thousand, or at least one million.) An array 380 may have an associated controller 379 arranged to control each package $350_{A1}$-$350_{H6}$ and each emitter in each package $350_{A1}$-$350_{H6}$. The controller 379 preferably provides electrical switching and current adjustment utility, and may further interface with one or more sensors of various types. As indicated previously, one or more sensors of various types (e.g., temperature sensors, light sensors, etc.) may integrated into or associated with individual packages; such sensors may be similar integrated into or associated with the array 380 to enable responsive control of individual emitter packages or groups thereof, such as to provide desirably even backlighting, color enhancement utility, and/or color correction utility.

Solid state emitter packages $350_{A1}$-$350_{H6}$ may be controllable in parallel and/or in series using the controller 379. In one embodiment, multiple packages $350_{A1}$-$350_{H6}$ are controllable in series in groups or clusters, and multiple groups or clusters are controllable in parallel. In another embodiment, a controller includes an associated programmable switching array (not shown) that may be used for selectively controlling groups of packages $350_{A1}$-$350_{H6}$ in series or in parallel without requiring rewiring of connections between the controller 379 and the multiple packages $350_{A1}$-$350_{H6}$.

FIG. 5B provides a perspective schematic assembly view of various layers of a display device 390A including at least one multi-emitter package (e.g., emitter packages 50, 50' as disclosed herein), and more preferably an array 380A of emitter packages, useable as a backlight to illuminate text and/or images generated by a liquid crystal display (LCD) panel 384A. Polarizing filters 382A, 388A may be provided on or over either face of the LCD panel 384A. In one embodiment, one or more color filters 386A are provided between the LCD panel 384 and the viewer. In another embodiment, each emitter package $350_{A1}$-$350_{H6}$ includes individually controllable red, green, and blue emitters, and such that each emitter package $350_{A1}$-$350_{H6}$ is controllable as a colored pixel to eliminate need for the one or more color filters 386A. Each emitter package $350_{A1}$-$350_{H6}$ preferably further includes a white light emitter (e.g., a blue solid state emitter having an associated yellow phosphor), with the white light emitter being useable, for example, to provide enhanced brightness and/or general lighting or backlighting utility while separate red, green, and blue emitters being individually controllable for each monolithic package to operate as an image reproduction pixel. Such display device 390A may be embodied in a modular (e.g., stadium or convention) display, a television, a computer monitor, a personal digital media device, a scientific instrument, or a similar system.

Referring to FIG. 5C, in another embodiment, an array of multi-emitter packages (e.g., emitter packages 50, 50' as disclosed herein) may be used as a direct imaging array 380B of a display device 390B, without need for an overlying LCD panel. One or more filters, mixers, or other optical elements may be disposed between the direct imaging array 380B and a viewer. The direct imaging array 390A may be embodied in a modular (e.g., stadium or convention) display, a television, a computer monitor, a personal digital media device, a scientific instrument, or a similar system.

One or more solid state emitter packages (including arrays of solid state emitter packages) as disclosed herein may be combined with any one or more features disclosed in any of the following patents or printed publications directed to backlight and/or display elements: U.S. Patent Application Publication No. 2006/0221272 to Negley, et al.; U.S. Pat. No. 5,359,345 to Hunter; and U.S. Patent Application Publication No. 2008/0198112 to Roberts.

In one embodiment, an enclosure comprises an enclosed space and at least one lighting device as disclosed herein, wherein upon supply of current to a power line, the at least one lighting device illuminates at least one portion of the enclosed space. In another embodiment, a structure comprises a surface and at least one lighting device as disclosed herein, wherein upon supply of current to a power line, the lighting device illuminates at least one portion of the surface. In another embodiment, a lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost.

Color reproduction is typically measured using the Color Rendering Index (CRI). CRI is a relative measurement of how the color rendition of an illumination system compares to that of a blackbody radiator, i.e., it is a relative measure of the shift in surface color of an object when lit by a particular lamp. The CRI equals 100 if the color coordinates of a set of test colors being illuminated by the illumination system are the same as the coordinates of the same test colors being irradiated by the blackbody radiator. Daylight has the highest CRI (of 100), with incandescent bulbs being relatively close (about 95), and fluorescent lighting being less accurate (70-85).

In general, the 1931 CIE Chromaticity Diagram (an international standard for primary colors established in 1931, reproduced as FIG. 6A), and the 1976 CIE Chromaticity Diagram (similar to the 1931 Diagram but modified such that similar distances on the Diagram represent similar perceived differences in color, reproduced as FIG. 6B) provide useful reference for defining colors as weighted sums of colors. The spectral colors are distributed around the edge of the outlined space, which includes all of the hues perceived by the human eye. The boundary line represents maximum saturation for the spectral colors. The curve arranged in the interior of the 1976 CIE Chromaticity Diagram is representative of the blackbody locus. A similar curve may be defined in the 1931 CIE Chromaticity Diagram.

The emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI.

There exist "white" LED light sources which are relatively efficient but which have poor color rendering, typically having CRI values of less than 75, and which are particularity deficient in the rendering of red colors and also to a significant extent deficient in green. So called "warm white" LEDs have a more acceptable color temperature for indoor use, and good CRI, but their efficiency is much less then half that of the standard "white" LEDs. Employing LEDs having a wide variety of hues would similarly necessitate use of LEDs having a variety of efficiencies, including some with low efficiency, thereby reducing the efficiency of such systems.

U.S. Pat. No. 7,213,940 to Van de Ven, et al. discloses devices and methods addressing the foregoing challenges. Solid state emitter packages as described herein may be combined with any one or more features as described in the foregoing U.S. Pat. No. 7,213,940. In some embodiments, devices may provide mixtures of light having x, y coordinates on a 1931 CIE Chromaticity Diagram that define a point within ten MacAdam chromaticity difference ellipses, preferably within five MacAdam chromaticity difference ellipses, in some cases within three MacAdam chromaticity difference ellipses, of at least one point on the blackbody locus of the 1931 CIE Chromaticity Diagram.

Further embodiments provide additional bases for addressing the foregoing challenges—namely, providing high color rendering index, acceptable color corrected temperature, and relatively high efficiency—by supplementing neutral white lamps with red and green spectra. In various embodiments, such spectral supplementation could be performed with any suitable combination of the following: one or more red solid state emitters, one or more green solid state emitters, one or more red lumiphors, and one or more green lumiphors.

A neutral white XLamp® emitter device (Cree, Inc., Durham, N.C.) was selected as a starting baseline, since it provides a positive balance between efficacy and CRI. A sample neutral white XLamp® emitter was characterized as having a CRI of 88 and efficacy of 99 lumens at 350 milliamps of current. FIG. 7 provides overlaid emission spectra (intensity % versus wavelength) for a neutral white XLamp® emitter device, a green LED emitter, and a red LED emitter, with spectra for blue and amber LEDs also provided for sake of comparison.

A study was performed including use of a neutral white XLamp® emitter device (99 lumens; color corrected temperature at dominant wavelength of 4515 K, radiant power of 0.3697 W), with standard red and green distributions from XLamp® XR-C LED emitters or XLamp® XR-E LED emitters (Cree, Inc., Durham, N.C.)—the red emitters having color corrected temperature (CCT) at dominant wavelength of 622 K, and the green emitters having color corrected temperature (CCT) at dominant wavelength of 524 K. Results of a first comparison are represented in FIG. 8A and summarized in the following Table 2:

Tables including data including lumens, lumens/watt, forward voltage, and watts as a function of current for three red and/or green emitters (Cree XLamp® XR-C red, XR-C red, and XR-E) at 25° C. and 100° C. are provided in FIG. 9A and FIG. 10A, respectively. Line charts showing efficacy (lumens/watt as a function of current) of the emitters of FIGS. 9A-10A at 25° C. and 100° C. are provided in FIG. 9B and FIG. 10B, respectively.

Composite efficacy of selected combinations are summarized below. For the neutral white 99+5+5 case, power consumption is calculated as follows: 1.15+0.13+0.05 W=1.34 W (est.). Efficacy is calculated as 1091 m/1.33 W=81.61 m/W (4.8% reduction in efficacy), noting that individual constituent efficacies are 86.1, 37.9, and 83.3 lm/W. For the neutral white 99+15+10 case, power consumption is calculated as follows: 1.15+0.36+0.10 W=1.63 W (est.). Efficacy is calculated as 1241 m/1.61 W=77.01 m/W (11% reduction in efficacy), noting that individual constituent efficacies are 86.1, 41.7, and 83.3 lm/W.

Referring back to Table 2, plot number 403, with modest (5% flux each) additions of red and green spectra, an 88 CRI neutral white spectrum can be raised to 95 CRI, and CCT can be lowered significantly with this addition. Efficacy remains relatively high for use of the neutral white/red/green combination, with 4.8% and 11% drops from pure white (and it is noted that these drops could be reduced to about 3.3% and 11%, respectively, via use of a 39.8 μm red emitter). An optimal CCT lowering would be 300 K to 400 K. It is noted that a much lower CCT of 2940 K (representing a 575K shift) could be obtained with a 100 lumens white/40 lumens red/40 lumens green mix, but CRI would be an unacceptably low 64.

It is believed that red and green spectra are best suited to address deficiencies of CRI of white spectrum LED devices—more so than blue and amber. That is because blue is not different enough from royal to fill the cyan valley, and

| Plot number (FIG. 8A) | Baseline emitter | Baseline emitter lumens | Red emitter lumens | Green emitter lumens | Combined CRI | Combined CCT |
|---|---|---|---|---|---|---|
| 401 | Neutral white | 99 | 0 | 0 | 88.4 | 4515 |
| 402 | Neutral white | 99 | 4 | 5 | 94.6 | 4219 |
| 403 | Neutral white | 99 | 5 | 5 | 94.9 | 4104 |
| 404 | Neutral white | 99 | 7 | 7 | 94.0 | 3972 |
| 405 | Neutral white | 99 | 10 | 10 | 90.8 | 3799 |
| 406 | Neutral white | 99 | 15 | 10 | 84.7 | 3387 |

A second comparison involved a cool white XLamp® emitter device (108 lumens, color corrected temperature at dominant wavelength of 7191 K) coupled with red and green distributions as described in connection with the previous run, but with further comparison to a neutral white XLamp® emitter device combined with forty lumens each of red and green emissions. Results of a second comparison are represented in FIG. 8B and summarized in the following Table 3:

amber peaks at the same dominant wavelength as the phosphor (i.e., the yellow phosphor coupled with a blue emitter in the neutral white XLamp® emitter device) where plenty of spectral power is available. As a result, addition of amber is expected to primarily serve to lower CCT.

Although the foregoing study was focused primarily on optimizing CRI, CCT, and efficacy of combinations involving

| Plot number (FIG. 8B) | Baseline emitter | Baseline emitter lumens | Red emitter lumens | Green emitter lumens | Combined CRI | Combined CCT |
|---|---|---|---|---|---|---|
| 451 | Cool white | 108 | 0 | 0 | 73.4 | 7191 |
| 452 | Cool white | 108 | 5 | 5 | 82.9 | 6219 |
| 453 | Cool white | 108 | 10 | 10 | 87.2 | 5519 |
| 454 | Neutral white | 99 | 40 | 40 | 67.7 | 3637 | a neutral white base emitter, comparable efficacy values are expected for combinations involving a cool white base emitter.

The foregoing study demonstrates that CRI, CCT, and efficacy may be optimized by supplementing a white light emitter (e.g., a blue solid state emitter arranged to interact with a yellow lumiphor, or other emitters and/or emitter-lumiphor combinations adapted to emit white light) with red and green spectra. Preferably, such supplementation enhances light quality by elevates CRI of a conventional white light emitting device to a level of at least 90, more preferably at least 92, more preferably still at least 94. Such supplementation and light quality enhancement may be performed with multi-emitter packages (e.g., packages 50, 50') as disclosed herein. Sensing of light output by one or more packages so supplemented using at least one sensor, and responsively adjusting operating of one or more emitters disposed within a package, may be performed.

Further methods for enhancing light quality are disclosed in U.S. Pat. No. 7,095,056 to Vitta, et al., which is incorporated by reference. At least one supplemental light emitting diode may be used to adjust one or more properties of the generated light, and adjustments can be made to the generated light based on feedback. Solid state emitter packages (e.g., packages 50, 50') as described herein may be combined with any one or more features as described in U.S. Pat. No. 7,095,056.

The foregoing disclosure thus discloses various multi-emitter packages each including multiple LEDs, with features to enhance light output quality, efficiency, thermal properties, and/or controllability, and devices incorporating such packages While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A light emission package comprising:
a first solid state emitter including a first LED chip having a first emission spectrum in the visible range;
a second solid state emitter having a second emission spectrum in the visible range;
a third solid state emitter having a third emission spectrum in the visible range;
a first lumiphor coated on the first LED chip and arranged to receive at least a portion of the first emission spectrum and responsively emit a lumiphor emission spectrum, wherein the first emission spectrum and the lumiphor emission spectrum in combination are perceptible as white light;
an integral leadframe and a molded package body encasing at least a portion of the integral leadframe;
a common submount disposed between the integral leadframe and each of the first, second, and third solid state emitter, wherein each of the first, second, and third solid state emitter is mounted to the common submount; and
a single lens extending over and arranged to transmit emissions from each of the first, second, and third solid state emitter;
wherein each of the first, second, and third solid state emitter is independently controllable; and
wherein the first emission spectrum has a first dominant wavelength, and the second emission spectrum has a second dominant wavelength that is non-coincident with the first dominant wavelength.

2. The light emission package of claim 1, further comprising a fourth solid state emitter mounted to the common submount;
wherein the fourth solid state emitter is controllable independently of the first, second, and third solid state emitter; and
wherein the fourth solid state emitter has a fourth emission spectrum in the visible range, and the fourth emission spectrum has a dominant wavelength that is non-coincident with each of the first and the second dominant wavelength.

3. The light emission package of claim 2, wherein the dominant wavelength of the fourth emission spectrum is non-coincident with the third dominant wavelength.

4. The light emission package of claim 3, further comprising an electrically inactive thermally conductive heatsink in conductive thermal communication with the submount and arranged to conduct heat away from the first, second, third, and fourth solid state emitter.

5. The light emission package of claim 1, having a total lumen output of at least 450 lumens.

6. The light emission package of claim 1, further comprising a first plurality of electrically conductive leads protruding from a first side wall of the molded package body, and a second plurality of electrically conductive leads protruding from a second side wall of the molded package body, wherein the second side wall opposes the first side wall.

7. The light emission package of claim 6, wherein each of the first plurality of electrically conductive leads and the second plurality of electrically conductive leads comprises at least three electrically conductive leads.

8. The light emission package of claim 1, further comprising an electrically inactive thermally conductive heatsink in conductive thermal communication with the submount and arranged to conduct heat away from the first, second, and third solid state emitter.

* * * * *